United States Patent [19]

Hundt

[11] Patent Number: 5,283,717

[45] Date of Patent: Feb. 1, 1994

[54] CIRCUIT ASSEMBLY HAVING INTERPOSER LEAD FRAME

[75] Inventor: Michael J. Hundt, Double Oak, Tex.

[73] Assignee: SGS-Thomson Microelectronics, Inc., Carrollton, Tex.

[21] Appl. No.: 986,117

[22] Filed: Dec. 4, 1992

[51] Int. Cl.⁵ .............................................. H05K 5/02
[52] U.S. Cl. ..................................... 361/813; 361/749; 361/760; 361/785; 257/666; 257/787; 174/52.2; 174/255; 174/260
[58] Field of Search ............... 361/380, 392, 397, 398, 361/400, 401, 403, 404, 413, 414, 421; 257/666, 787; 174/52.2, 255, 260, 261

[56] References Cited

U.S. PATENT DOCUMENTS

| | | | |
|---|---|---|---|
| 4,705,917 | 11/1987 | Gates, Jr. et al. | 174/52 FP |
| 5,031,022 | 7/1991 | Yamamoto et al. | 357/70 |
| 5,105,257 | 4/1992 | Michii | 357/70 |

Primary Examiner—Leo P. Picard
Assistant Examiner—Young S. Whang
Attorney, Agent, or Firm—Dennis T. Griggs; Lisa K. Jorgenson; Richard K. Robinson

[57] ABSTRACT

A circuit assembly includes a finger lead assembly having structure for supporting an interposer substrate assembly and an electronic circuit device, the substrate assembly having conductive elements for providing electrical connection between finger leads of the lead assembly and respective circuit sections within the circuit device. The circuit device is mounted proximate to an upper surface of the substrate assembly. At least one decoupling capacitor is mounted on a lower surface of the substrate assembly at a level below that of the finger leads and electrically connected, through circuitry within the substrate assembly including inter-level via connectors, to respective circuits within the circuit device.

12 Claims, 7 Drawing Sheets

CIRCUIT ASSEMBLY HAVING INTERPOSER LEAD FRAME

FIELD OF THE INVENTION

The present invention relates generally to electronic packaging and, more particularly, to high density circuit modules having integrated circuit chips and having multiple conductors connected to respective circuits within the integrated circuit chips.

BACKGROUND OF THE INVENTION

In the design of circuit modules having integrated circuit chips it is desirable that the circuit modules be of compact construction, and that leads and conductive elements connected to circuits within the integrated circuit chips be as short as possible to minimize inductive interference and noise. Typically, such a circuit assembly includes a number of conductive fingers supported within a body of non-conductive encapsulant material and connected to external pins or terminals, and conductive elements interconnected between the fingers and respective circuits within the chip, for providing power, ground, and signal lines.

It is preferable to minimize the length of such lines through the use of an intermediate, interposer substrate on which the integrated circuit chip may be mounted and whereby leads may be connected between nodes or terminals on the chip and corresponding conductors on the interposer substrate. However, prior-art circuit modules utilizing such interposer substrates have suffered from several limitations and deficiencies. One such limitation is that conductors and electrical components mounted on the interposer substrates have been undesirably crowded, resulting in potential inductive interference when high frequency signals are present on one or more adjacent conductors. For example, digital, analog, and input/output circuits in such modules have been undesirably crowded together on such substrates or, alternatively, the substrates and lead frames have been required to be of undesirable complexity and size. Thus, the packaging of such circuit assemblies is a major factor in the design and manufacture of electronic systems, and new packaging techniques are required to achieve reduced physical size, improved reliability, and low cost. The need for such efficient packaging is particularly important with respect to electronic circuit assemblies which utilize compact circuit structures of the type implemented by large-scale-integration (LSI) techniques, utilizing semiconductor chips.

DESCRIPTION OF THE PRIOR ART

In the fabrication of a conventional circuit assembly including an integrated circuit die or chip, the chip is typically electrically connected to a plurality of finger lead elements of a finger lead frame assembly, and the chip and finger leads are sealed within a body of non-conductive encapsulant material for providing electrical insulation, heat dissipation, and structural support. A non-conductive substrate may be centrally mounted on the lead frame assembly, within the encapsulant body, for supporting and providing electrical connection to the integrated circuit chip, such substrates having conductive strips providing electrical connection between leads connected to the integrated circuit terminals and leads connected to conductive fingers on the lead frame, which in turn are continuous with or connected to external pins. Device terminals or leads are thereby connected through conductors o the substrate to external pins. Electrical interconnection, through conductors on the substrate, with other devices in the package, is also permitted. Fine gold wire leads are connected between respective conductive elements on the substrate and nodes or terminals on the integrated circuit chip, providing connection with device input-/output terminals and power terminals.

Because of industry standards relating to the exterior dimensions of such electronic circuit packages, including requirements for minimum spacing between leads and between lead rows, the presence of multiple leads has limited the number of circuit devices which can be incorporated within the encapsulations. Thus, as previously noted, there continues to be a need for increasing packaging density, particularly for circuits such as high density, application specific integrated circuits (ASIC) and semiconductor memory circuitry used in high speed data processing circuits such as random access memory circuits. For example, one industry packaging standard for memory devices specifies 300 mil row spacing, with external pins mounted on 100 mil centers in each row. Memory capacity for such packages can be upgraded, resulting in even greater packaging density.

As the capacity of integrated circuit chips is increased, the substrate area required to provide connections to circuits within the integrated circuits may also increase, thereby reducing to a minimum the area available for device lead attachments within packages of standard dimensions. Accordingly, various attempts have been made to redesign the packages to provide increased capacity in a compact design. It will be appreciated that the area available for the device substrate, for a given standard package, is also necessarily limited by the space required for device lead bonding and by the minimum dimensions necessary to provide an encapsulation. Thus, established standards for lead center spacing and limitations regarding package size and maximum number of external pins impose several limitations on such circuit components. Therefore, there is a continuing need for improved electronic circuit packaging which conforms with established industry packaging standards.

In certain high speed circuits, it is necessary to connect one or more "decoupling" or filtering capacitors between power and ground lines to minimize interference from high speed switching signals and the like. This is normally accomplished by mounting capacitors of appropriate values on a circuit board on which the module is mounted and providing appropriate electrical lines connecting the capacitors between respective ground and power terminals of the integrated circuit chip. However, it is preferable to incorporate such capacitors within the encapsulated integrated circuit package itself, for conserving circuit board area and reducing the inductance between the capacitors and associated lines, by reducing the lengths of associated connecting lines. Packaging size is also reduced, and the integrity of the package is enhanced.

Conventional circuits incorporating such capacitors within the encapsulated module have been undesirably crowded. The capacitors, when mounted on a substrate also supporting an integrated circuit, tend to interfere with other components unless the circuit module itself is undesirably large. This is particularly the case when multiple independent power supply circuits are incorporated within the integrated circuit, thereby necessitating multiple capacitors and connecting lines each of which must be isolated from each other and from other portions of the circuitry.

OBJECTS OF THE INVENTION

Accordingly, it is a principal object of the present invention to provide a new and improved electronic circuit package, having high circuit density, which nevertheless conforms with established industry packaging standards.

A related object is to provide such an electronic circuit package incorporating an interposer substrate assembly mounted on a supporting lead frame and adapted to receive an integrated circuit chip, the interposer substrate having conductive elements for providing electrical connection between circuit sections of the integrated circuit an respective conductive fingers of the lead frame.

Yet another object of the invention is to provide such an electronic circuit package in which the interposer substrate assembly includes upper and lower surfaces each having a plurality of electrical conductors formed thereon and, in which the integrated circuit is mounted on the upper surface of the substrate, wherein at least one decoupling capacitor is mounted on the lower surface of the interposer substrate assembly and electrically connected between power supply and ground terminals on the integrated circuit chip.

A still further object is to provide such a circuit package in which the integrated circuit includes multiple, isolated power supply circuits and in which the substrate assembly provides electrical connection between the multiple power supply circuits and respective capacitors mounted on the lower surface of the substrate assembly.

Other objects and advantages of the invention will become apparent from the specification and appended claims and from the accompanying drawing illustrative of the invention.

SUMMARY OF THE INVENTION

The foregoing objects are realized by a circuit assembly in which a finger lead assembly is adapted to support a non-conductive interposer substrate assembly, the finger lead assembly having multiple electrically conductive fingers which are respectively connected to corresponding electrically conductive elements on the interposer substrate, the interposer substrate assembly having a first surface supporting an integrated circuit chip and having multiple intra-level electrical conductors, connected between respective fingers of the lead frame and respective circuit nodes or terminals formed on the semiconductor chip. The intra-level conductors are also connected, through inter-level via conductors, to conductive strips on the opposite side of the substrate assembly. The new and improved circuit assembly provides an interposer substrate assembly adapted to receive one or more filter capacitors mounted on one side of the interposer substrate and an integrated circuit mounted on the opposite side of the interposer substrate.

The novel features which characterize the invention are defined by the appended claims. The foregoing and other objects, advantages, and features of the invention will hereinafter appear, and for purposes of illustration of the invention, but not of limitation, an exemplary embodiment of the invention is shown in the appended drawing.

DETAILED DESCRIPTION OF THE PREFERRED EMBODIMENTS

In the description which follows, an embodiment of the circuit assembly of the present invention is described having a logic circuit such as those implemented by MOS/LSI techniques on semiconductor substrates. It will be appreciated, however, that the circuit assembly may be used for supporting and interconnecting discrete as well as integrated circuit devices, although it has particular utility for integrated circuits requiring connection to decoupling or filtering capacitors. Similarly, the invention may be used for active or passive substrate devices having a variety of circuit elements including, but not limited to, discrete, micro-discrete, and integrated circuit components, and hybrid combinations of discrete and integrated devices.

Figure 5:
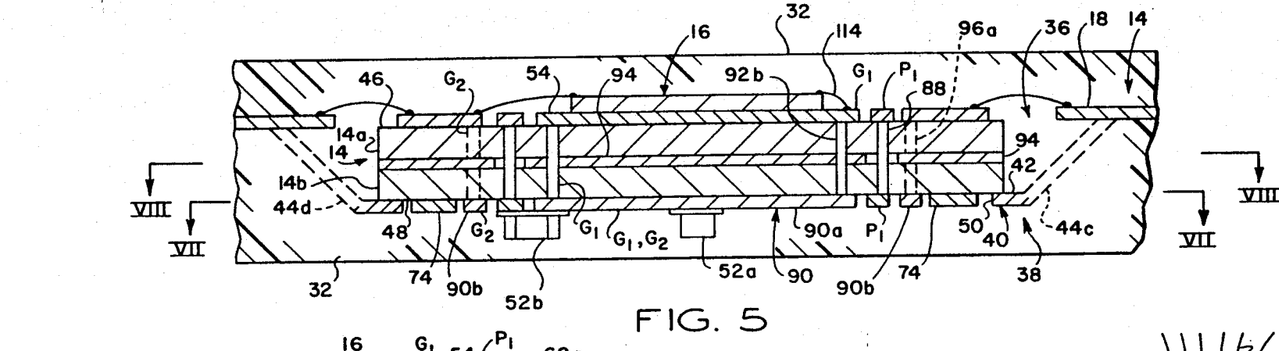
FIG. 5 is a cross-sectional view taken as on lines V—V of FIG. 3 showing the integrated circuit chip, the interposer substrate assembly, and the filtering capacitors.
Figure 6:
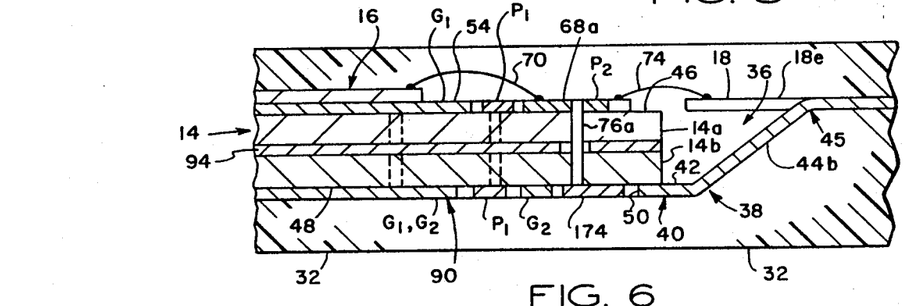
FIG. 6 is a fragmentary cross-sectional view taken as on line VI—VI of FIG. 3 and showing a portion of the substrate assembly and the support structure.

Like parts are marked throughout the specification and drawings with the same reference numerals, respectively. The drawing figures are not necessarily to scale, and in some instances portions have been exaggerated in order to more clearly depict certain features of the invention. In particular, the thickness of elements of the substrate assembly as shown in FIGS. 5 and 6 have been exaggerated for clarity.

Referring now to the drawings, and initially to FIG. 2, the circuit assembly 10 includes a multi-finger lead frame assembly 12, suitably of rectangular configuration, on which an interposer substrate assembly 14 and integrated circuit chip 16, all to be more fully described hereinbelow, are centrally mounted.

Figure 1:
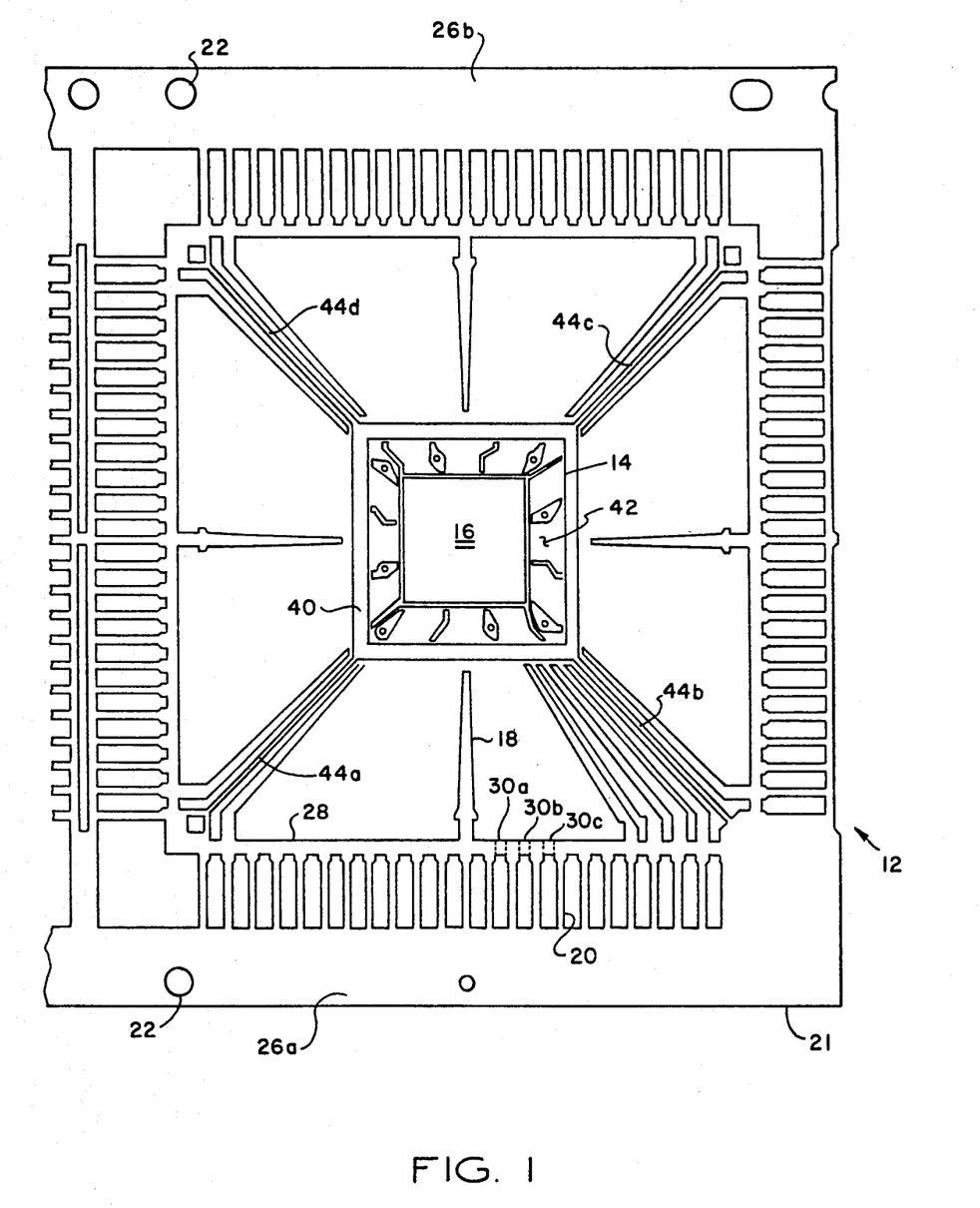
FIG. 1 is a plan view of circuit assembly of a preferred embodiment of the invention in a preliminary stage of its fabrication, showing the integrated circuit chip and the interposer substrate assembly mounted on a supporting conductive sheet in which a pattern of the finger lead frame assembly has been formed.

As seen in FIG. 1, the lead frame assembly 12 is in an intermediate stage of fabrication in which a pattern of radially extending fingers 18 and pins 20 have been cut in a strip of conductive material 21, prior to final cutting and forming operations. The fabrication of such lead frame assemblies and the mounting thereon of integrated circuit chips and supporting substrates is generally known in the art, as disclosed in U.S. Pat. Nos. 5,089,877; 4,441,119; 4,645,943; and 4,685,998, and such fabrication processes will therefore not be described in detail herein. In summary, however, the lead frame assembly 12 is formed from a continuous strip 21 of a metal alloy such as a nickel or iron alloy or, alternatively, a copper alloy such as CDA 194, wherein a pattern, such as that shown in FIG. 1, is stamped therein by means of a die or other cutting instrument.

With continued primary reference to FIG. 1, apertures 22 are formed in outer transport rails 26a and 26b of the conductive strip 21 and are engaged by the stamping and cutting apparatus, not shown, for transporting the strip of conductive material 21 during cutting operations. The conductive fingers 18 extend radially outwardly from the central region, adjacent the interposer substrate 14, to the peripheral edges of the rectangular lead frame assembly 12. The fingers 18 are formed integrally with a peripheral, sacrificial dam-bar strip 28, and with the conductive pins 20 extending radially outwardly from the peripheral dam-bar strip 28.

Figure 2:
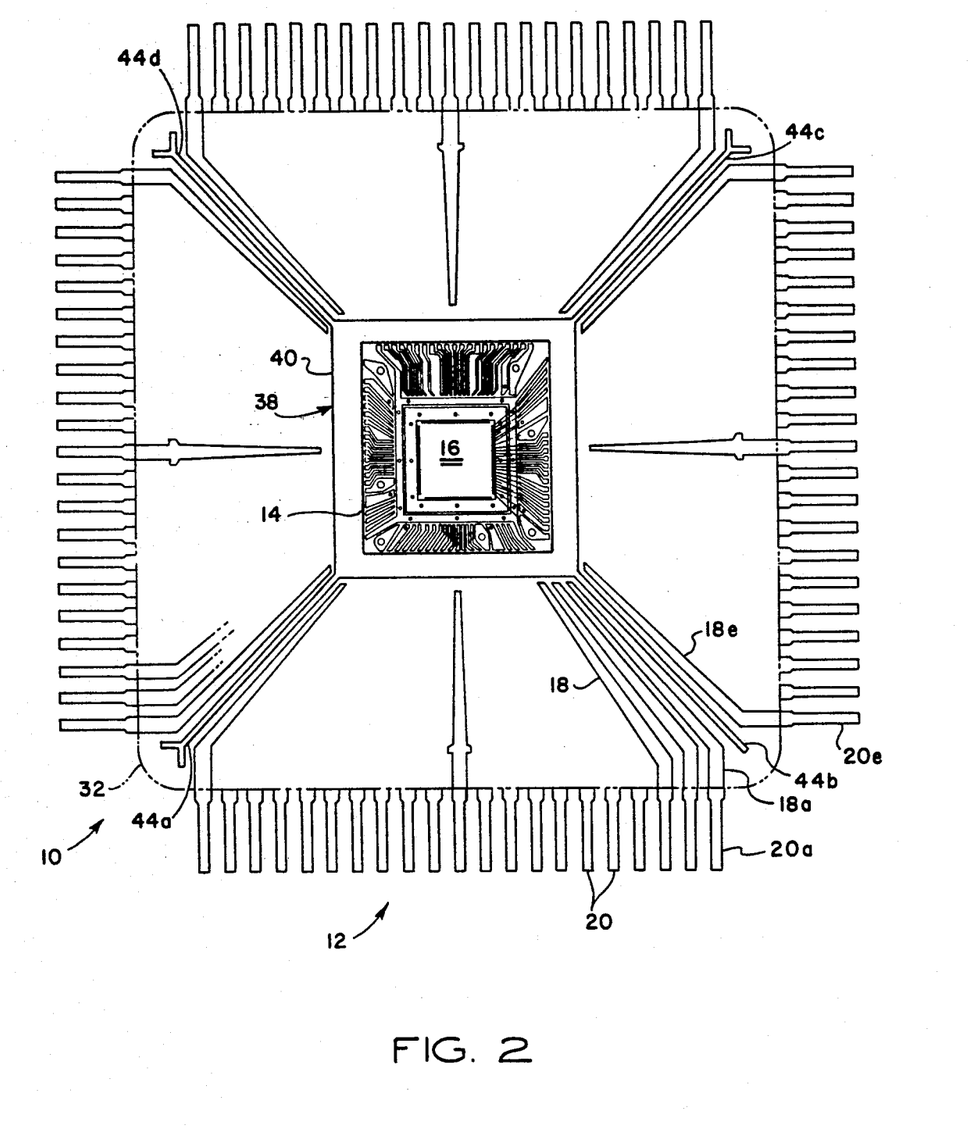
FIG. 2 is a plan view similar to FIG. 1 showing the finger lead frame assembly in a subsequent stage of its fabrication.

In accordance with processes known to those in the art, in a subsequent fabrication step, the area within the dam-bar strip 28 is filled with a non-conductive encapsulant material such as an epoxy, and linking segments, indicated at 30a, 30b, 30c, and the outer transport rails 26a, 26b are cut away, wherein the pins 20 and associated finger leads 18 are separated and electrically isolated from each other, as seen in FIG. 2. The cured encapsulant forms a generally rectangular molded body 32 (FIGS. 2, 5, and 6) extending to the outer, rectangular periphery formerly defined by the dam-bar strip 28 (FIG. 1) As will be understood by those in the art, the pins 20 suitably may be bent downwardly adjacent the molded encapsulant body 32 (FIG. 2) for facilitating their attachment to corresponding nodes formed on a supporting circuit board.

Figure 3:
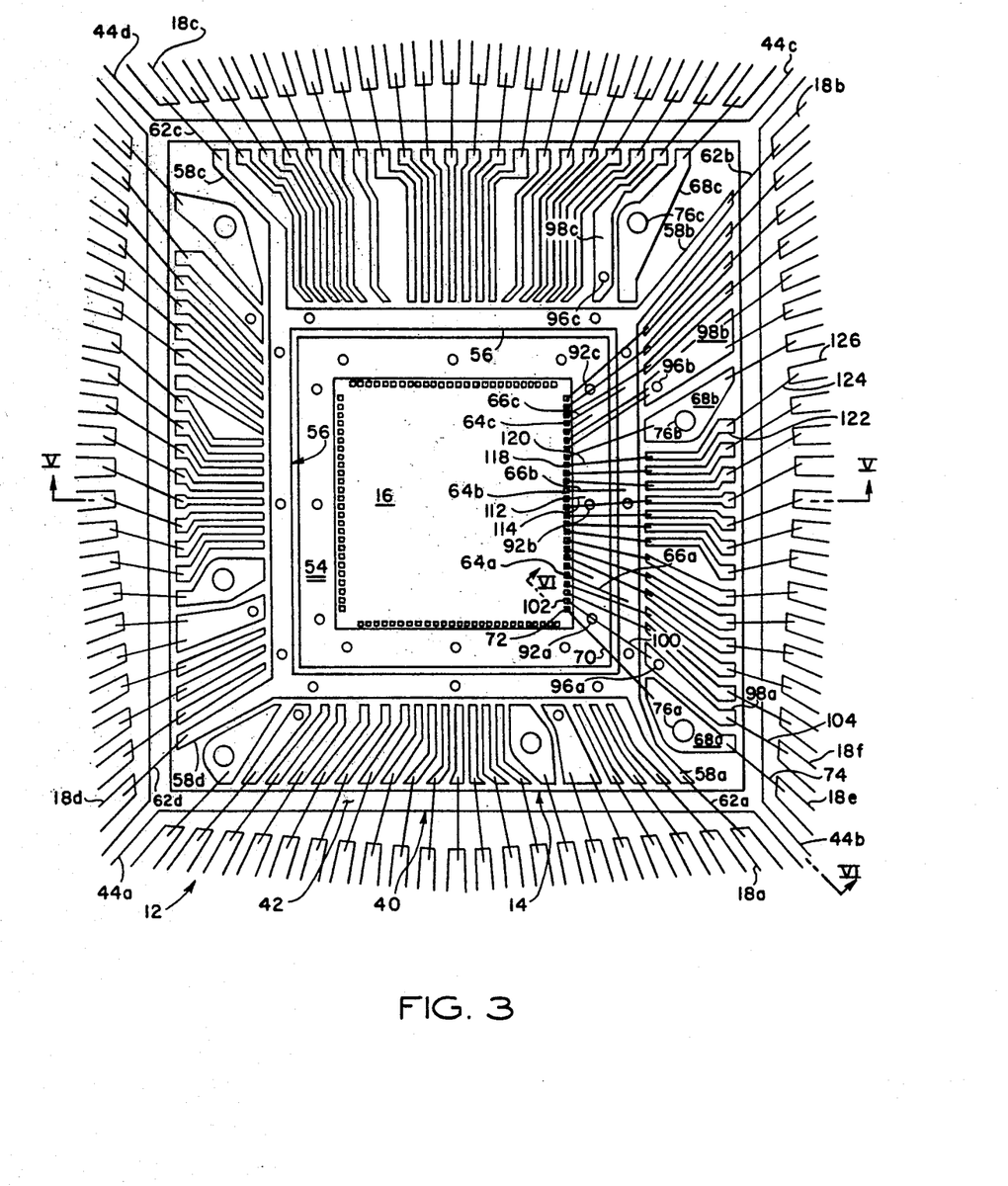
FIG. 3 is an enlarged plan view showing the interposer substrate assembly upper surface and the integrated circuit chip, and showing leads connected between respective elements of the chip and adjacent conductive elements, and leads connected between the conductive elements and respective, adjacent finger leads.

With respect now to the construction and mounting of the substrate assembly 14, and with primary reference to FIGS. 3 and 5, the substrate assembly 14 includes at least one planar substrate 14a (FIG. 5), of a non-conductive material such as an epoxy-fiberglass, having a thickness of about 1 mm. In the illustrative embodiment, the substrate assembly 14 includes first and second substrates 14a, 14b stacked one above the other, as will be described in greater detail hereinbelow. A rectangular depression 36 is centrally formed in the lead frame 12 for receiving the interposer substrate assembly 14, the interposer substrate assembly being seated upon a support structure 38 which is depressed below the plane of the surrounding, radially extending finger leads 18 by a distance preferably approximately equal to the thickness of the interposer substrate assembly 14.

Figure 4:
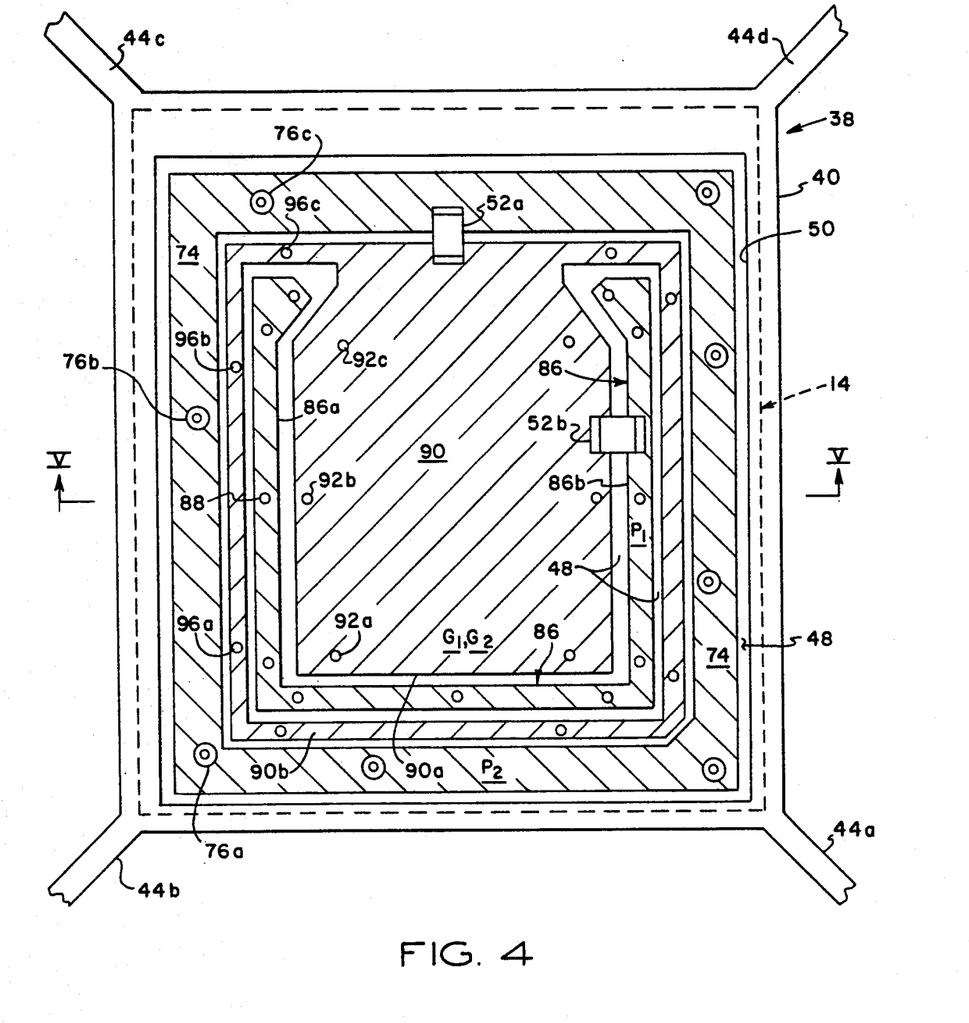
FIG. 4 is a plan view showing the lower surface of the interposer substrate assembly and the filtering capacitors an showing the frame structure supporting the interposer subtract assembly.

The support structure 38 suitably consists of a frame 40, of rectangular configuration in plan, as seen in FIG. 4, defining a floor, seat, 42 FIG. 5), supported by radially extending spiders 44a, 44b, 44c, and 44d, known in the art as "tie bars," which are physically separated from the adjacent finger leads 18 subsequent to encapsulation but continue to be physically connected to the support structure 38, as shown in FIGS. 5 and 6. As seen most clearly in FIG. 6, the spider 44b, as typical, is bent downwardly, as indicated at 45, at a location spaced outwardly from the substrate assembly 4, whereby the rectangular frame 40 is depressed below the adjacent finger leads 18. This deflection of spiders 44a, 44b, 44c, 44d is accomplished during the initial cutting and stamping of sheet 21 (FIG. 1) by means of corresponding upper and lower stamping molds, not shown, in accordance with process will known in the art. With primary reference to FIG. 5, the interposer substrate assembly 14 is seated within the depression 36 upon the floor, seat, 42 of the support structure 38, wherein the upper surface 46 of the substrate assembly 14 is in substantially parallel alignment with the plane defined by the conductive fingers 18, and its lower surface 48 rests on the floor, seat, 42 formed by the rectangular frame 40.

The substrate assembly 14 is affixed to the support structure 38 by a suitable adhesive, such as an epoxy. As seen most clearly in FIG. 4, the rectangular support structure 38 thus includes a central cutout portion defining a rectangular opening 50 centrally formed therein. As seen more clearly in FIG. 4, the support structure 38, in the present embodiment constitutes a rectangular, frame-like ledge in register with and extending under the outer periphery of the substrate assembly 14, whereby the substrate assembly extends across the opening 50. As will be more fully understood from the description hereinbelow, the opening 50 permits the mounting of components, such as decoupling capacitors 52a, 52b, on the portion of the substrate lower surface 48 extending across and over the opening 50, whereby the capacitors project downwardly through the opening 50. Advantages which accrue from this construction will also become apparent from the description to follow.

With primary reference to FIG. 5 and as discussed briefly above, the interposer substrate assembly 14 is preferably formed of non-conductive substrate layers 14a, 14b, suitably comprising respective non-conductive, laminate layers of epoxy-fiberglass upon which conductive strips and conductors, to be described, are formed. Such conductors are suitably formed of a layer of conductive metal, such as copper plated with a non-corrosive metal such as gold, the pattern of conductors and strips suitably being formed by selective etching processes well known to those skilled in the art. With primary reference to FIGS. 3 and 5, a conductive ground layer 54, suitably of square configuration in plan, is centrally formed on the upper surface 46 (FIG. 5) of substrate assembly 14 by the selective etching process discussed above. As will be more fully described hereinbelow, in the present, illustrative embodiment, the conductive ground layer 54 forms a part of a first ground circuit G providing electrical connection to ground circuits within the IC chip 16 and to an external ground. The integrated circuit chip 16 is centrally located on the ground layer 54 and bonded to its upper surface suitably by means of an electrically conductive epxoxy adhesive.

And as will be more fully discussed hereinbelow, the integrated circuit chip 16 (of the present embodiment of the circuit assembly 10) includes first and second power and ground circuits, designated herein $P_1$, $P_2$ and $G_1$, $G_2$, respectively, which are connected to respective external power sources and grounds through intra-level conductive elements formed on the upper surface 46 of the substrate assembly 14, between the central ground layer 54 formed beneath the chip 16 and the radially extending finger leads 18. For clarity of description, the terms $P_1$ and $P_2$ are thus used herein with reference to the first and second power supply circuits, and G and are used with reference to first and second ground circuits.

Referring to FIG. 3, a $P_1$ power plane strip 56 of rectangular configuration in plan, spaced from and extending peripherally around the $G_1$ conductive layer 54, is provided for distributing a positive power supply voltage, typically 3-5 volts D.C., to the IC chip 16. Power plane strip 56 is formed integrally with radially extending conductive fingers or trace segments 58a, 58b, 58c, and 58d which are electrically connected with respectively adjacent finger leads 18a, 18b, 18c, 18d by means of lead wires 62a, 62b, 62c, 62d. Electrical connection between the respective conductive elements of the interposer substrate assembly 14 and the nodes of the integrated circuit chip 16 is thus suitably provided by fine gold wires 62.

For example, gold wires having a diameter of 1.3 mil are suitable for low current signals and, in some embodiments, somewhat larger wires e.g., of 5 mils, are suitably used for higher current, power supply wires, although in most applications the wires will of uniform gage. Bonding of the gold wires 62 to the nodes and substrate conductors is preferably accomplished by means of conventional thermosonic ball bonding techniques, as known to those in the art. Subsequently, the gold wires are supported and insulated by the encapsulant 32. With additional reference to FIG. 2, finger lead 18a, as typical, is electrically continuous with pin 20a for permitting connection with a source of $P_1$ potential from an external power supply, not shown.

The integrated circuit chip 16 includes a plurality of $P_1$ power supply terminals or nodes, such as nodes 64a, 64b, 64c (FIG. 3), which are internally connected to respective sections of the $P_1$ power circuit. The $P_1$ power supply nodes 64a, 64b, 64c are connected by means of respective lead wires 66a, 66b, 66c to the $P_1$ power plane strip 56. Thus, the $P_1$ power plane strip 56 provides a conductive loop providing a common bus which permits convenient connection to multiple $P_1$ power supply nodes on the IC chip by means of short conductive leads, such as leads 66a, 66b, 66c, obviating the need for multiple leads of much greater lengths for connecting the $P_1$ nodes with respective finger leads.

In addition to the $P_1$ power supply strip 56, and the $G_1$ ground layer 54, the circuit assembly 10 further employs common conductors formed on the lower surface 48 of the interposer substrate assembly 14, whereby increased density of electrical circuitry connected to the IC chip 16 is permitted and whereby trace conductors and wire leads connecting multiple power, ground, and signal circuits within the chip 16 to respective finger leads 18 of the lead frame assembly 12 are as short as possible and sufficiently mutually spaced to prevent unwanted inductive interference between respective power, ground, and signal circuits. With continued reference to FIG. 3, multiple $P_2$ trace conductors, of which conductors 68a, 68b and 68c are typical, are formed on the upper surface 46 of the substrate assembly 14, spaced outwardly from the $P_1$ power plane strip 56, and extend radially outwardly from the $P_1$ power plane strip 56 toward the finger leads 18. With respect to the first $P_2$ conductor 68a as typical, wire lead 70 is connected between the trace conductor 68a and an adjacent $P_2$ power node 72 on the IC chip 16, and a second wire lead 74 is connected between the $P_2$ trace conductor 68a and an adjacent finger lead 18e which is electrically continuous with a pin 20e (FIG. 2) for providing electrical connection between an external power supply, not shown, and $P_2$ power supply nodes 72 within the IC chip 16. The $P_2$ trace conductors 68a, 68b, 68c are connected to a second, $P_2$ power plane strip 74, formed on the lower surface 48 of the substrate assembly 14, through respective interlevel via connectors 76a, 76b, 76c.

Figure 9:
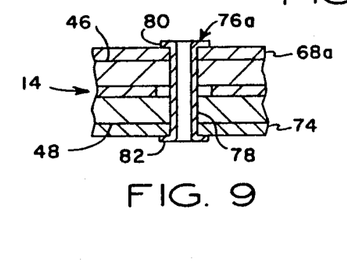
FIG. 9 is an enlarged, fragmentary cross-sectional view of a portion of the interposer substrate assembly showing one of the inter-surface, through-hole connectors.

With additional reference to FIG. 9, the via connectors 76, of which via 76a is typical, are suitably formed as tubular members extending through corresponding bores formed vertically through the substrate assembly 14. Thus, via 76a has a tubular body 78 extending through substrate assembly 14 and having upper and lower grommet-shaped flanges 80, 82 extending over, and formed in electrical contact with, adjacent electrical conductive elements, such as elements 68a, 74, formed on the upper and lower substrate assembly surfaces 46, 48, respectively. Inter-level vias 76a, 76b, 76c (FIG. 3) thus provide electrical connection between $P_2$ conductors 68a, 68b, 68c and the $P_2$ power plane strip 74 (FIGS. 4 and 7) which defines a closed loop of rectangular configuration extending around the lower substrate assembly surface 48 beneath and in register with the $P_2$ connectors 68a, 68b, 68c. Other, unnumbered $P_2$ trace connectors and vias are formed on the upper surface 46 on the other three sides of the chip 16 in register with the $P_2$ power plane strip 74, and are similarly connected to strip 74.

Figure 7:
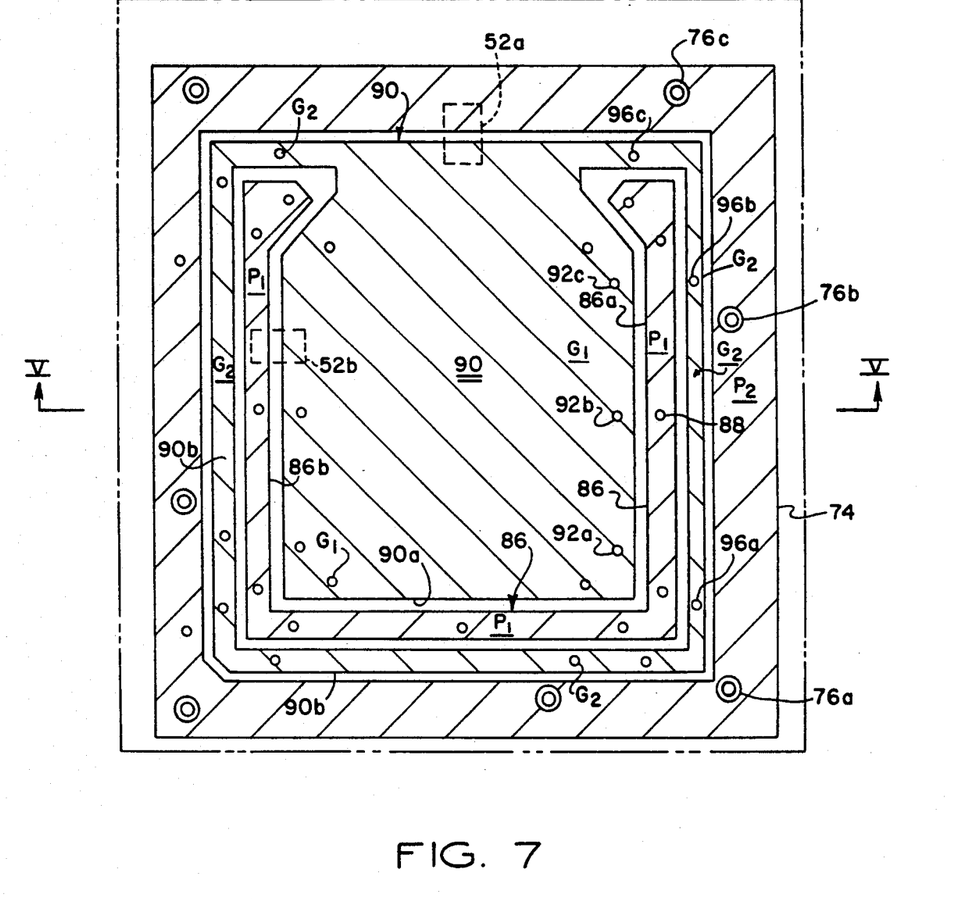
FIG. 7 is a downwardly directioned, plan view of the conductive elements formed on the lower surface of the substrate assembly, taken as on line VII—VII of FIG. 5.

Similarly, a second $P_1$ power-plane strip 86 (FIGS. 4 and 7), of U-shaped configuration in plan and having legs 86a, 86b, is formed on the substrate assembly lower surface 48 in register with the upper, first $P_1$ power plane strip 56, and spaced laterally within the $P_2$ power strip 74. The (upper) first and (lower) second $P_1$ power plane strips 56 and 86 are electrically connected by inter-level vias such as via 88. In FIG. 7, the conductive elements formed on lower substrate assembly surface 48 are shown as they would appear to a viewer looking downwardly through the substrate assembly 14, for facilitating correlation of their respective positions with corresponding conductive elements formed in the upper surface 46, and with the interlevel vias. Their appearance and orientation as viewed from a location below the circuit assembly is shown in FIG. 4, in which the support structure 38 is also shown. A common $G_1$, $G_2$ ground layer 90 is also formed on the lower substrate assembly surface 48.

As seen most clearly in FIG. 4, the common ground layer 90, in the present embodiment, includes a central, generally rectangular portion 90a which extends between legs 86a, 86b of the U-shaped, second $P_1$ power plane strip 86, and a U-shaped closed loop strip portion 90b which extends around the periphery of the U-shaped, second $P_1$ power plane strip 86, between the strips 86 and the rectangular $P_2$ power strip 74. Inter-level vias such as vias 92a, 92b, 92c extend between the upper $G_1$ ground layer 54 and the central portion 90a of the lower $G_1$, $G_2$ common ground layer 90. The interlevel G vias 92a, 92b and 92c are also electrically connected with an intermediate ground layer 94 formed between the upper and lower substrate layers 14a, 14b, deposited on one of the confronting surfaces of substrate layers 14a, 14b, for providing electrical shielding between the conductive elements and electrical components formed on the upper and lower substrate assembly surfaces 46, 48.

Figure 8:
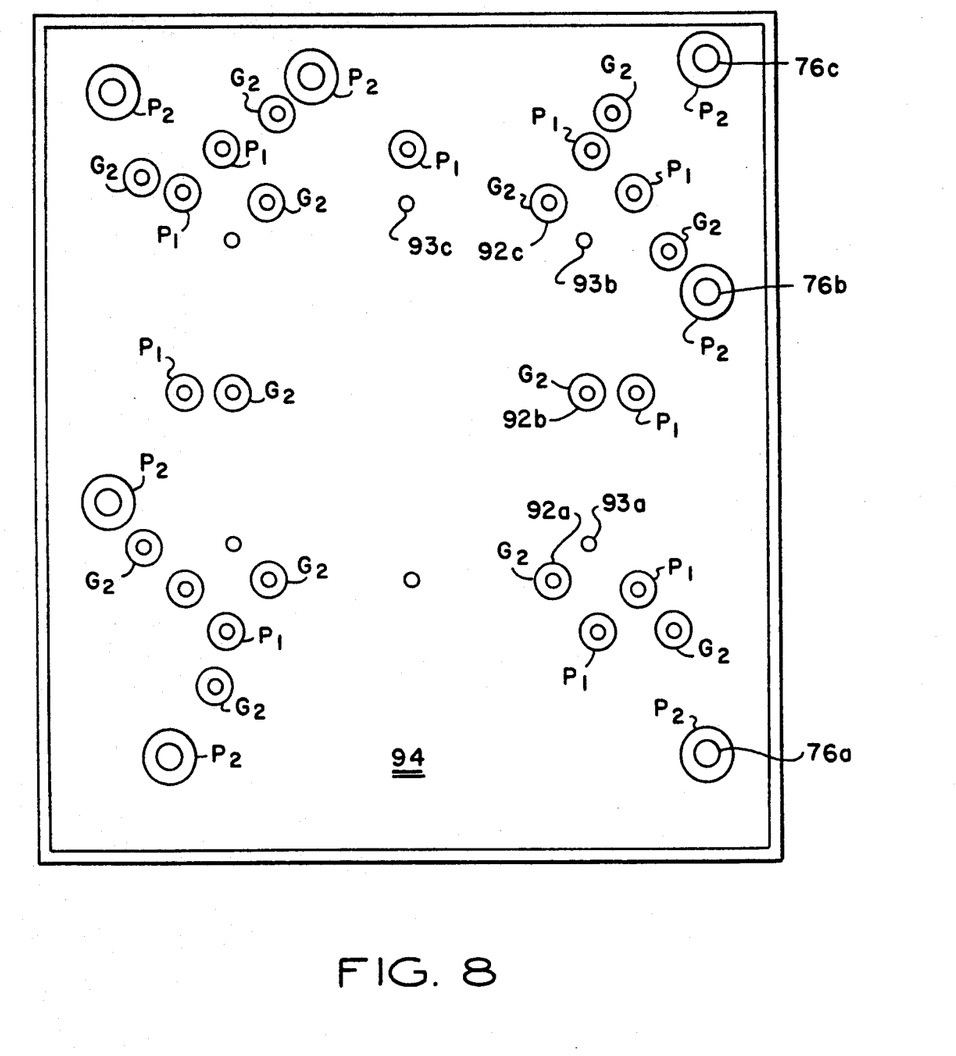
FIG. 8 is a downwardly directioned, plan view of the intermediate conductive layer of the substrate assembly taken as on line VIII—VIII of FIG. 5.

As further shown in FIG. 8, vias 93a, 93b, 93c, as typical, are connected between the intermediate conductive ground layer 94 and the $G_1$ ground layer 54, but do not extend to the lower substrate surface 48. Similarly, the looped, U-shaped strip portion 90b of the common $G_1$, $G_2$ lower ground layer 90 is connected by means of vias, such as vias 96a, 96b, 96c to respective $G_2$ conductive traces, 98a, 98b, 98c (FIG. 3) formed on the upper substrate assembly surface 46. Trace 98a (FIG. 3), as typical of to $G_2$ ground node 102 of IC chip 16, and through wire lead 104 to finger lead 18f, providing connection with an external ground.

Figures 10, 11:
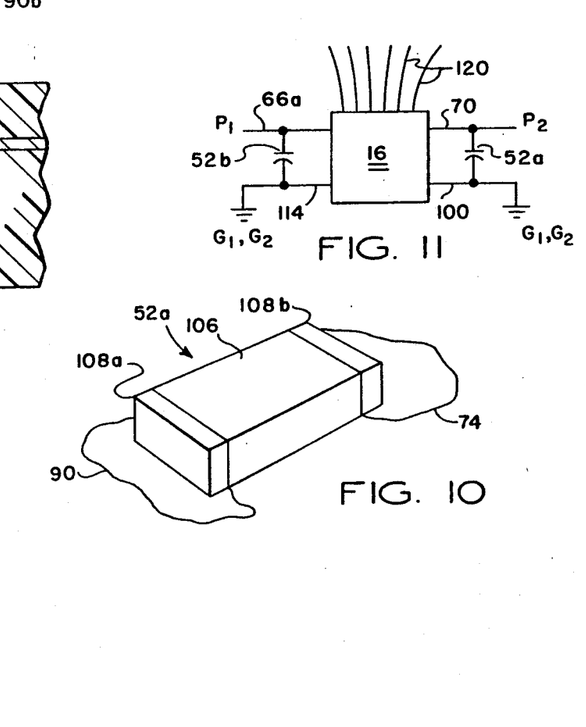
FIG. 10 is a perspective view of one of the decoupling capacitors illustrating its electrical connection to portions of the interposer substrate.
FIG. 11 is a schematic diagram of portions of the electrical circuits formed on the substrate assembly.

As previously stated, because of the need for attenuating or blocking undesired high frequency signals which may be induced between adjacent circuit elements in such miniature circuit assemblies, blocking or shunting capacitors have been connected between adjacent power and ground lines in prior-art circuits. In the present circuit assembly, ceramic capacitors 52a, 52b, suitably having capacitance levels of one microfarads, are connected between the $P_1$ and $P_2$ circuits and ground. With primary reference to FIG. 4, capacitor 52a is connected between common $G_1$, $G_2$ ground layer 90 and the $P_2$ power supply strip 74. Similarly, capacitor 52b is connected between the common $G_1$, $G_2$ ground layer 90 and the leg 86b of $P_1$ power strip 86. Referring to FIG. 10, the capacitor 52a, as typical, suitably has a non-conductive rectangular body 106 connected between first and second, conductive end caps 108a, 108b, which are suitably bonded by a conductive adhesive, such as a sliver-filled epoxy adhesive such as Amicon CT-5047-2, to ground layer 90 and $P_2$ power strip 74, respectively. Capacitors 52a, 52b thus serve as shunting or blocking capacitors connected between ground and the $P_2$ and $P_1$ power supply circuits, respectively, for removing high frequency switching signals.

The circuit assembly 10 thus provides common power and ground conductors positioned on several overlapping substrate surfaces for the purpose of minimizing the lengths of conductive lines connected between the individual nodes on the integrated circuit and the finger leads 18, for minimizing inductance between multiple power and ground lines, and whereby it is not necessary to provide multiple overlapping leads connected directly between the integrated circuit nodes and respective ones of the finger leads 18.

With initial reference to FIG. 3, one of the $P_1$ circuits will now be described. $P_1$ positive potential is applied through finger lead 18a, which is connected through fine wire lead 62a to trace conductor 58a, which is integral with the first $P_1$ power plane strip 56. $P_1$ potential on the power strip 56 is supplied through a plurality of wire leads, such as lead 66a, to corresponding, respective $P_1$ nodes 64a supplying power to respective sections of the $P_1$ power circuit within the integrated circuit chip 16. The $P_1$ circuit is completed through the $G_1$ ground circuit, and, $G_1$ node 112, as typical, is connected through wire lead 114 to the $G_1$ conductive layer 54, which is connected through inter-surface vias, such as via 92b, to the common $G_1$ $G_2$ ground layer 90 formed on the lower surface 48 of substrate assembly 14.

The common ground layer 90 is connected through vias, such as via 96a, to $G_2$ trace conductors such as conductor 98a formed on the upper surface 46, the $G_2$ trace conductor 96a being connected by means of wire lead 104 to finger lead 18f, which is connected to an external ground, completing the circuit. Similarly, $P_2$ potential is applied through finger leads such as lead 18e, through wire lead 74, to $P_2$ trace conductor 68a, which in turn is connected through wire lead 72a to $P_2$ input node 72 on the integrated circuit chip 16. The second power supply circuit is returned to ground through the $G_2$ trace conductors 98. Representative $G_2$ node 102 is connected through wire lead 100 to $G_2$ trace conductor 98a which is connected through wire lead 104 to finger lead 18f, which in turn is connected to the external ground. Additionally, the $P_2$ trace conductor 68a is connected through inter-surface via 76a which, as shown most clearly in FIG. 6, extends downwardly and is electrically connected with $P_2$ power strip 74 extending peripherally around the lower substrate assembly surface 48.

Thus, the potential applied through the $P_2$ circuit is routed through via 76a to the power strip 74, and through the first blocking capacitor 52a to common $G_1$, $G_2$ ground element 90 for shunting away and removing undesired high frequency switching signals within the $P_2$ power circuit. Similarly, high frequency signals applied through the $P_1$ power supply circuit are conducted through inter-level vias, such as via 88, to the $P_1$ second power plane strip 86 mounted on the lower substrate assembly surface 48, through which they are conducted through capacitor 52b to the common ground layer 90 for removing undesired switching signals from the $P_1$ circuit.

Referring to FIG. 11, the schematic diagram represents typical portions of the circuit assembly, in which capacitors 52a and 52b are connected between common ground $G_1$, $G_2$ and $P_2$ and $P_1$, respectively. Additionally, a plurality of signal leads 120 are connected to respective portions of the circuits within the IC chip 16. Referring additionally to FIG. 3, signal lead 120, as typical, is connected between node 118 and trace element 122, which is connected by lead 124 to signal finger lead 126. Whereas the present circuit assembly thus provides two filtered power supply circuits, it should be understood that additional supply circuits may be provided by the use of additional conductive elements. Further, additional circuit elements may be mounted on additional substrate layers if required for a particular application.

With reference to FIGS. 4 and 5, because the support structure 38 is depressed below the level of the surrounding finger leads 18, the substrate assembly 14, with upwardly projecting, integrated circuit chip 16 and the downwardly projecting capacitors 52a and 52b, may be mounted centrally within the encapsulant body 32 whereby the trace conductors formed on the upper surface of the substrate assembly are substantially coplanar with the lead fingers 18, and whereby leads connecting the fingers to the trace conductors, such as lead 74 (FIG. 6), may be substantially shorter than would be the case if they were required to extend to lead fingers aligned with the lower surface of the substrate assembly 14. Additionally, because the substrate assembly 14 is seated upon the floor 42 of rectangular frame 40 and extends over the rectangular opening 50, the capacitors 52a, 52b may project downwardly, through the opening 50 within the encapsulant body 32. This construction provides an important advantage over prior-art conventional circuit assemblies in that the circuit assembly encapsulated within the encapsulant body 32 is of compact and thinner construction that would be the case if the capacitors were required to be mounted on the upper surface of the substrate assembly 14. Additionally, the conductive vias connecting the capacitors 52a, a52b with the respective power circuits $P_1$, $P_2$ are substantially shorter than the conductive elements and lines which otherwise would be required if the capacitors were mounted externally of the encapsulant body 32, requiring the routing of conductive lines externally of the encapsulant body 32 to such discrete capacitors. The circuit assembly 10 thus provides a compact, rugged package providing internal inductive noise reduction for a plurality of discrete power circuits.

As will now be understood, the use of the interposer substrate assembly 14, having conductive conductors or strips formed on opposite surfaces thereof and on respective internal surfaces thereof, and connected by inter-level via connectors, facilitates interconnection of the finger leads and various power and signal circuits on the chip and efficiently routes the power supply and ground circuits, whereby the circuit assembly 10 is of increased density but, nevertheless, is of compact, rugged construction. The cutout opening 50 of the support structure 38, permits the decoupling capacitors 52a, 52b to be mounted below the interposer substrate assembly 14, opposite the chip 16, whereby the module body 32 is of compact construction, as discussed above, and wherein the entire circuit assembly 10, including decoupling capacitor 52a, 52b is protected by the encapsulant material. As will be appreciated by those in the art, inductive interference between the power supply circuits $P_1$, $P_2$ is thereby greatly reduced, and the device density may be substantially increased. Additionally, the use of multiple, isolated power and ground distribution conductors such as 56, 74, 86, and 90, mounted on both sides of the substrate assembly 14 as permitted by the present circuit assembly, serves further to minimize lead lengths and prevent unwanted interference between adjacent conductive elements.

While only one embodiment of the invention, together with modifications thereof, has been described in detail herein and shown in the accompanying drawing, it will be evident that various further modifications are possible in the arrangement and construction of its components without departing from the scope of the invention.

What is claimed is:

1. A circuit assembly comprising, in combination:
a finger lead assembly having a plurality of conductive finger leads and having a support structure, the support structure defining a seat having an opening therethrough;
an interposer substrate assembly mounted on the support structure seat and having a portion extending over the opening, the substrate assembly having a first surface adjacent the support structure seat and a second, oppositely facing surface;
an electronic circuit device mounted on the substrate assembly adjacent the second surface of the substrate assembly, the circuit device having a power circuit and having power and ground nodes connected to the power circuit;
a capacitor mounted on the substrate assembly adjacent the first surface of the substrate assembly and in alignment with the opening; and
electrical connecting means, having inter-level connectors extending between the first and second substrate assembly surfaces, for connecting the capacitor between the power and ground nodes of the circuit device.

2. The circuit assembly defined in claim 1, wherein the finger lead assembly, the interposer substrate assembly, the electronic circuit device, and the capacitor are encapsulated within a body of non-conductive material, the body of non-conductive material extending within the opening and adjacent the capacitor and the portion of the first surface of the substrate assembly extending over the opening.

3. The circuit assembly defined in claim 1, wherein the finger leads of the finger lead assembly are substantially copolaner with the second surface of the interposer substrate assembly.

4. The circuit assembly defined in claim 1, the support structure of the lead frame assembly being recessed below the finger leads, the support structure comprising means for supporting the interposer substrate assembly over the opening and in parallel alignment with the finger leads.

5. The circuit assembly defined in claim 4, wherein the capacitor projects through the opening.

6. A circuit assembly comprising, in combination:
a body of non-conductive material;
a finger lead assembly encapsulated within the body of non-conductive material, the finger lead assembly having a support structure and a plurality of conductive finger leads, in substantially co-planar array, adjacent the support structure and extending radially outwardly therefrom, and a plurality of support members connected to the support structure and extending outwardly therefrom, the support structure defining a seat which is depressed below the finger leads, the seat having an opening therethrough;
an interposer substrate assembly mounted on the seat defined by the support structure, the substrate assembly having an upper surface and an oppositely facing, lower surface adjacent the seat;
an electronic circuit device mounted adjacent the upper surface of the substrate assembly, the circuit device having a power circuit and having positive and ground nodes connected to the power circuit;
a capacitor mounted on the lower surface of the substrate assembly, the capacitor extending, through the opening defined by the support structure, below the support structure;
electrical connecting means, having inter-level connectors extending between the upper and lower substrate assembly surfaces, for connecting the capacitor between power and ground nodes of the circuit device.

7. The circuit assembly defined in claim 6, wherein the electronic circuit device includes a plurality of discrete power circuits each having at least one power source supply terminal and at least one ground terminal, and wherein a plurality of capacitors ar mounted adjacent the second surface of the interposer substrate assembly, inter-level connecting means being provided for connecting the capacitors across respective power and ground nodes for filtering high frequency signals within respective power circuits.

8. The circuit assembly defined in claim 6, wherein the support structure comprises a rectangular ledge having an upper surface defining the seat, the substrate assembly nesting within the support structure in register with the rectangular ledge and extending across the opening.

9. A circuit assembly comprising, in combination:
a finger lead assembly having a plurality of conductive finger leads and having a support structure having an opening therethrough;
an interposer substrate assembly mounted on the support structure and having a portion extending over the opening, the substrate assembly having a first surface facing the support structure and a second, oppositely facing surface;
an integrated circuit mounted on the substrate assembly adjacent the second surface of the substrate assembly, the integrated circuit having first and second circuit nodes and circuitry electrically connected to the circuit nodes;
an electrical device mounted on the substrate assembly adjacent the first surface of the substrate assembly and being aligned within the opening formed through the support structure; and
electrical connecting means, having inter-level conductors extending between the first and second substrate assembly surfaces, for connecting the electrical device between the first and second nodes of the integrated circuit.

10. The circuit assembly defined in claim 9, wherein the electrical device projects, from the first surface of the substrate assembly, through the opening formed through the support structure.

11. The circuit assembly defined in claim 9, wherein the electrical device comprises capacitor means for filtering high frequency signals within the integrated circuit.

12. The circuit assembly defined in claim 9, wherein the first and second nodes comprise power and ground nodes, and wherein the electrical device comprises a filter capacitor.

* * * * *